(12) United States Patent
Dittmer et al.

(10) Patent No.: US 7,248,110 B2
(45) Date of Patent: Jul. 24, 2007

(54) MODIFIED DOHERTY AMPLIFIER

(75) Inventors: Timothy Wilfred Dittmer, Mason, OH (US); George Cabrera, Mason, OH (US)

(73) Assignee: Harris Corporation, Melbourne, FL (US)

( * ) Notice: Subject to any disclaimer, the term of this patent is extended or adjusted under 35 U.S.C. 154(b) by 99 days.

(21) Appl. No.: 11/294,742

(22) Filed: Dec. 6, 2005

(65) Prior Publication Data

US 2007/0139106 A1 Jun. 21, 2007

(51) Int. Cl.
*H03F 3/68* (2006.01)
(52) U.S. Cl. .................. 330/124 R; 330/295
(58) Field of Classification Search ............ 330/124 R, 330/295
See application file for complete search history.

(56) References Cited

U.S. PATENT DOCUMENTS

| | | | |
|---|---|---|---|
| 2,210,028 | A | 8/1940 | Doherty |
| 5,886,575 | A | 3/1999 | Long |
| 6,285,251 | B1 | 9/2001 | Dent et al. |
| 6,396,341 | B1 | 5/2002 | Pehlke |
| 6,472,934 | B1 | 10/2002 | Pehlke |
| 6,510,175 | B1 | 1/2003 | Hunsinger et al. |
| 6,982,593 | B2 * | 1/2006 | Robinson et al. ............. 330/10 |
| 7,053,706 | B2 * | 5/2006 | Kwon et al. ............ 330/124 R |
| 7,071,775 | B2 * | 7/2006 | Gailus et al. ........... 330/124 R |

FOREIGN PATENT DOCUMENTS

| | | |
|---|---|---|
| EP | 1592126 A1 | 11/2005 |
| WO | 02054589 A2 | 7/2002 |
| WO | 02095933 A1 | 11/2002 |

OTHER PUBLICATIONS

European Search Report EP 06 02 5033.

* cited by examiner

*Primary Examiner*—Patricia Nguyen
(74) *Attorney, Agent, or Firm*—Tarolli, Sundheim, Covell & Tummino L.L.P.

(57) ABSTRACT

Systems and methods are provided for efficient amplification of a signal utilizing a modified Doherty amplifier system. A modified Doherty amplifier system includes a nonlinear main amplifier and a nonlinear auxiliary amplifier. An impedance-inverting network separates the main amplifier from an associated load. A second quarter wave transmission line separates the auxiliary amplifier from an associated signal source. The signal source has an associated minimum signal power, such that the signal power never drops below a predetermined percentage of a peak signal power.

17 Claims, 4 Drawing Sheets

MODIFIED DOHERTY AMPLIFIER

TECHNICAL FIELD

The present invention relates to RF communication systems and is particularly directed to systems and methods for amplifying a signal using a modified Doherty amplifier.

BACKGROUND OF THE INVENTION

In many applications, amplifier design requires a balance between linearity and efficiency. Linear (e.g., class A) amplifiers can provide a linear signal at a significant cost in efficiency. More efficient, nonlinear (e.g., class C) amplifiers are available, but these amplifiers tend to suffer from intermodulation and harmonic distortion. A compromise is found in the Doherty amplifier, which utilizes multiple forms of amplifiers to achieve fairly efficient, low distortion amplification of a signal over a wide range of signal power.

FIG. 1 is a functional block diagram of a Doherty amplifier system 10. The Doherty amplifier system 10 comprises a plurality of amplifiers 12 and 14 connected in parallel as to amplify a signal from a signal source 16. The amplifiers include a linear main amplifier 12, which is always operating, and a nonlinear auxiliary amplifier 14 that operates when the power from the signal source reaches a threshold level (e.g., one-quarter peak power). The auxiliary amplifier 14 is connected to the signal source 16 by a first quarter wave transmission line 20, with its output provided to a load 22. The main amplifier 12 is connected to the load through an impedance-inverting network 24 (e.g., quarter wave transmission line).

When the signal power from the signal source 16 is low, the auxiliary amplifier 14 is disabled by a drive control, and the linear main amplifier 12 provides all of the amplification for the signal. When the power of the signal reaches the threshold level, a drive control 18 activates the auxiliary amplifier 14. The activation of the auxiliary amplifier 14 lowers the overall impedance experienced by the main amplifier 12 and allows the signal power to be split between the two amplifiers. Accordingly, the overall efficiency of the system is increased without significantly impacting the linearity of the amplifier system.

SUMMARY OF THE INVENTION

In accordance with an aspect of the present invention, a modified Doherty amplifier system is provided. The system includes a nonlinear main amplifier and a nonlinear auxiliary amplifier. An impedance-inverting network separates the main amplifier from an associated load. A second quarter wave transmission line separates the auxiliary amplifier from an associated signal source.

In accordance with another aspect of the present invention, a method is provided for amplifying a signal of interest. The signal of interest is generated such that the signal of interest has a minimum power that is greater than a predetermined fraction of its peak power. A first portion of the signal power of the signal of interest is amplified at a first nonlinear amplifier operating at saturation. A second portion of the signal power from the signal of interest is amplified at a second nonlinear amplifier operating at saturation.

In accordance with yet another aspect of the present invention, an amplifier system is provided for amplifying an in-band, on-channel digital audio broadcasting composite radio frequency signal from an associated signal source to provide an amplified RF signal to an associated load. A first nonlinear amplifier operates in a saturated region. A second nonlinear amplifier operates in a saturated region. The first and second amplifier circuits being connected together in parallel and being located intermediate to the signal source and the load.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

Figure 1:
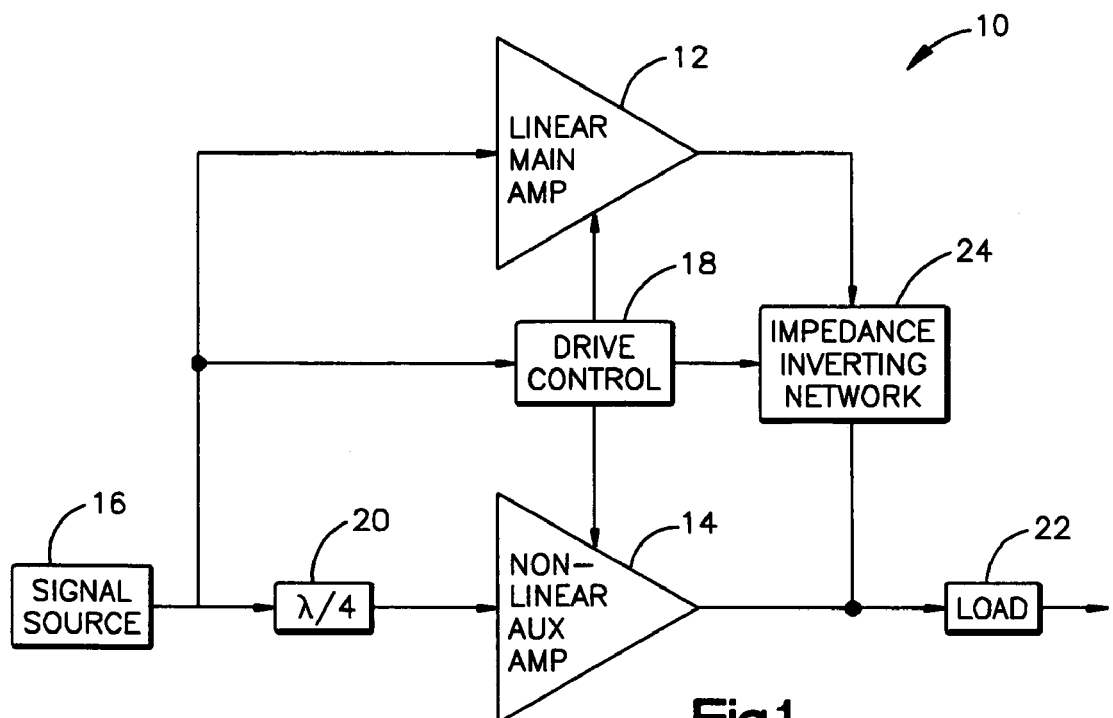
FIG. 1 is a functional block diagram of a Doherty amplifier system.
Figure 2:
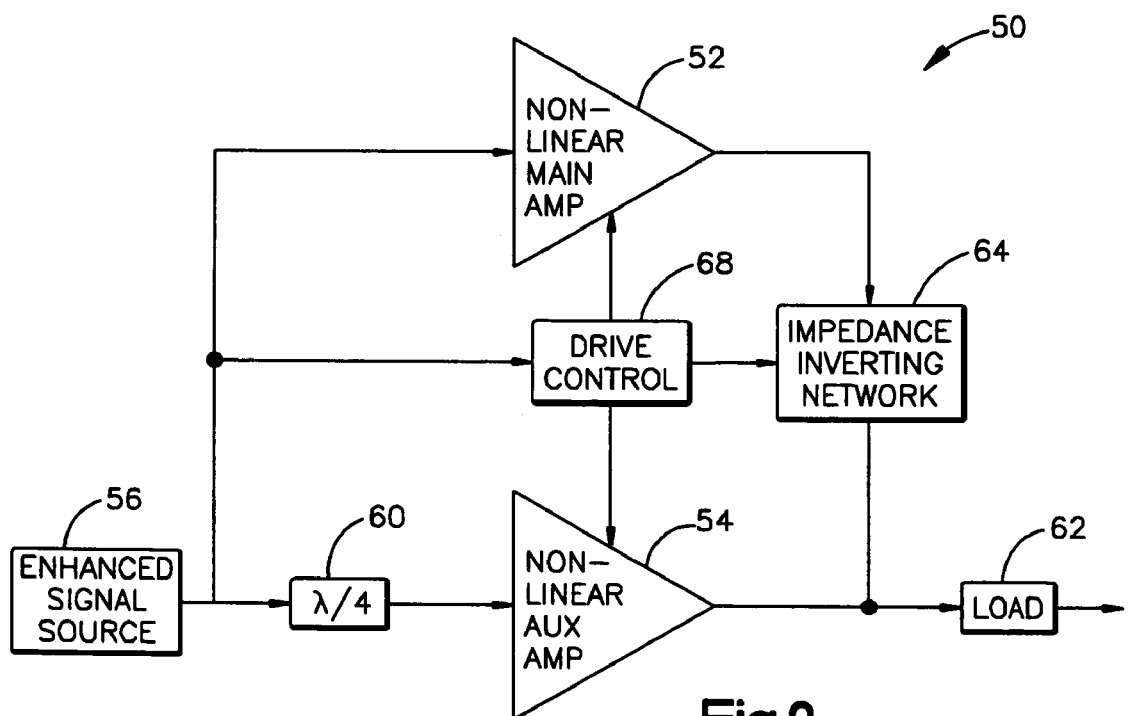
FIG. 2 is a functional block diagram of a modified Doherty amplifier system having enhanced efficiency.

FIG. 2 is a functional block diagram of a modified Doherty amplifier system 50 having enhanced efficiency. The Doherty amplifier system 50 comprises a plurality of nonlinear amplifiers 52 and 54, connected in parallel as to amplify a signal from a signal source 56. The amplifiers include a nonlinear main amplifier 52, which is always operating, and a nonlinear auxiliary amplifier 54 that operates when the power from the signal source reaches a threshold level (e.g., one-quarter peak power). The auxiliary amplifier 54 is connected to the signal source 56 by a first quarter wave transmission line 60, with its output provided to a load 62. The main amplifier 52 is connected to a load through an impedance-transforming network 64 (e.g., quarter wave transmission line).

In accordance with an aspect of the present invention, the signal source 56 can be enhanced such that its peak power never drops below the threshold level. It will be appreciated that the implementation of the enhanced signal source 56 does not necessarily require the use of additional hardware to maintain the minimum signal power. For example, in an exemplary system for in-band on-channel (IBOC) digital radio in the U.S., a digitally-modulated signal and a constant envelope analog carrier signal are uncorrelated and maintained at a sufficient FM to IBOC ratio such that their sum, a composite FM+IBOC signal, naturally remains at or above one-quarter of the peak signal power. Other applications for the illustrated system will be apparent to one skilled in the art.

Accordingly, the main amplifier 52 for the modified Doherty amplifier system 50 will always operate around its saturation point. Since the main amplifier 52 does not drop below saturation, a nonlinear (e.g., class C) amplifier is utilized for the main amplifier to increase the efficiency of the system 50. An activation voltage associated with the auxiliary amplifier 54 can be selected according to the minimum signal power, such that when the input voltage at the minimum signal power is detected at a drive control 68, the auxiliary amplifier 54 can be active. Accordingly, both amplifiers 52 and 54 can be operated in saturation for all possible values of the signal power, allowing for efficient amplification of the signal over the desired range.

In accordance with an aspect of the present invention, the respective gains, $G_m$ and $G_a$, of the main and auxiliary amplifiers 52 and 54 can be adjusted to maintain a region of linear operation through the expected range of signal power from the signal source 56. In a typical Doherty amplifier, the gain ratio, $G_a/G_m$, is equal to two. In an extended Doherty system, the amplifier system is adjusted to allow for a larger gain ratio between the main and auxiliary amplifiers 52 and 54. An optimal gain ratio for such a system can be determined by known design equations to be equal to $\gamma$, where $\gamma$ is a function of the high efficiency range, specifically:

$$\text{Range}_{HE} = 20[\log_{10}(\gamma)]\text{dB} \quad \text{(Eq. 1)}$$

It will be appreciated that the activation point $1/\beta_1$ for the nonlinear main amplifier 52 in the illustrated system 50 will be larger than a similar linear amplifier. Accordingly, the gain of the main amplifier 52 can be boosted to compensate for this increase in activation voltage. Similarly, the main amplifier should reach saturation at the point where the auxiliary amplifier is switched on. In the illustrated system, the auxiliary amplifier is turned on when the voltage of the signal reaches $1/\gamma$ of a known maximum input voltage, $V_{max}$. These conditions can be met by setting the gain of the main amplifier such that:

$$G_m = \frac{\beta_1}{\beta_1 - \gamma} \quad \text{(Eq. 3)}$$

The gain for the auxiliary amplifier at a voltage of $V_{max}/\gamma$ will be equal to $\gamma$, the same as an auxiliary amplifier in a classic Doherty system. Accordingly, the gain ratio for the illustrated system 50 can be expressed as:

$$G_{ratio} = \frac{G_a}{G_m} = \frac{\gamma(\beta_1 - \gamma)}{\beta_1} \quad \text{(Eq. 4)}$$

Accordingly, the overall gain for the system 50 is zero for input voltages smaller than $V_{max}/\beta_1$ and nonlinear for voltages between $V_{max}/\beta_1$ and $V_{max}/\gamma$. For voltages greater than $V_{max}/\gamma$, however, the system 50 acts as a LINC (Linear Amplification using Nonlinear Components) system. Since the signal source 56 can be selected or enhanced such that it does not produce signals having a voltage smaller than $V_{max}/\gamma$, the amplifier system 50 will operate linearly with a high degree of efficiency.

Figure 3:
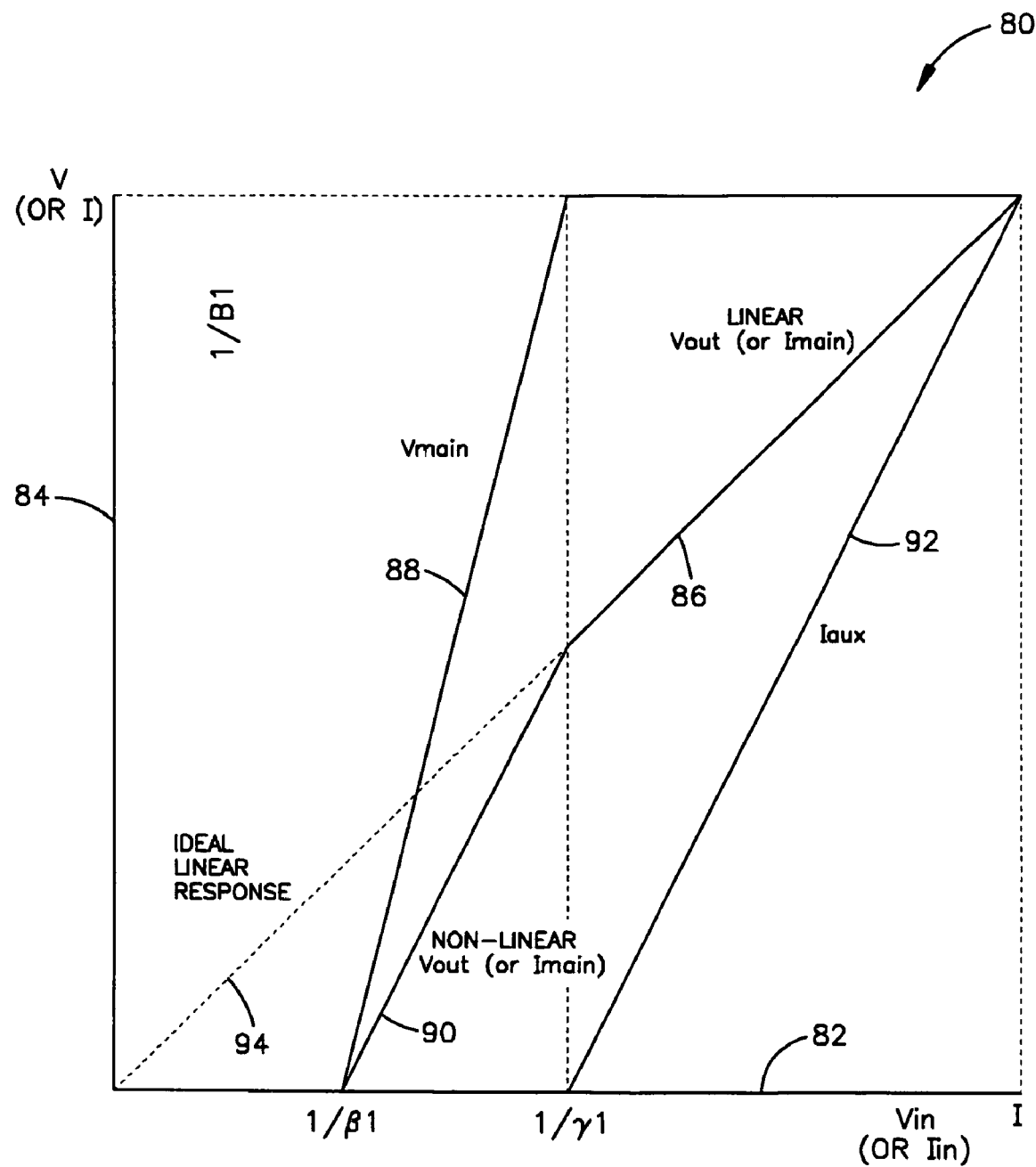
FIG. 3 is a chart illustrating a relationship between the input voltage of a modified Doherty amplifier system in accordance with an aspect of the present invention, and its associated output voltage.

FIG. 3 is a chart 80 illustrating a relationship between the input voltage or current 82 of a modified Doherty amplifier system in accordance with an aspect of the present invention, and a voltage or current at various points within the modified Doherty system 84. The illustrated chart is normalized, such that the maximum value of both the input voltage, the input current, the output voltage of the system, and the output current is equal to one. The chart 80 illustrates the linear voltage response 86 produced by the modified Doherty amplifier over a limited region of operation.

When the input voltage is below an activation voltage, $1/\beta_1$, the modified Doherty amplifier does not produce an output. Once the activation voltage, $1/\beta_1$, is reached, the main amplifier activates, producing a voltage 88 at the main amplifier that quickly ramps up to saturation as the input voltage increases to a value equal to the inverse of a selected gain ratio, $1/\gamma$, for the system. The output voltage of the system 90 increases steadily to about one-half the peak output voltage at a voltage equal to the inverse of the gain ratio.

Once the input voltage reaches this point, the auxiliary amplifier activates, reducing the load on the main amplifier and producing a current 92 that increases steadily until the auxiliary amplifier reaches saturation at a maximum input voltage. The combined outputs of the auxiliary amplifier and the saturated main amplifier approximates an ideal linear response 94 associated with the system between the voltage, $1/\gamma$, at which the auxiliary amplifier activates and the maximum input voltage. Accordingly, by selecting an appropriate activation point and gain ratio for the system, a linear response for the modified Doherty amplifier system can be achieved with high efficiency over a desired range of operation. In one implementation, a nonlinear precorrection component (not shown) may be used to used linearize the system gain (e.g., achieve constant system gain and phase) over the entire voltage range.

Figure 4:
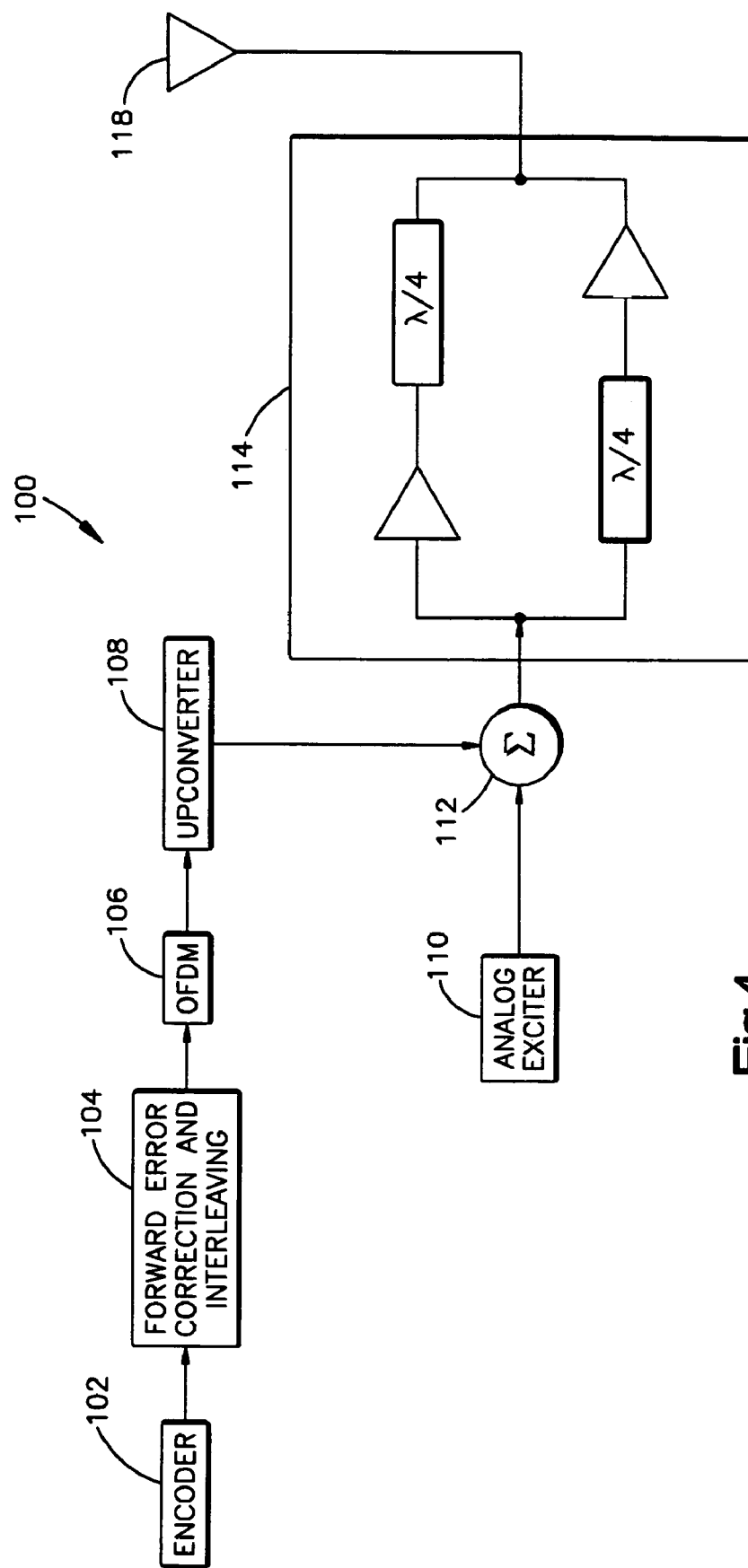
FIG. 4 is a functional block diagram of an exemplary IBOC digital audio broadcast system utilizing a modified Doherty amplifier in accordance with an aspect of the present invention.

FIG. 4 is a functional block diagram of an exemplary IBOC digital audio broadcast (DAB) system 100 utilizing composite crest factor reduction in accordance with an aspect of the present invention. The transmitter system 100 comprises an encoder 102 that encodes an analog source signal into a digital audio signal. The digital signal is encoded as a quadrature phase shift keying (QPSK) such that a plurality of two-bit symbols are encoded as one of four vector states, each having an associated phase. The audio encoder 102 removes redundant information from the audio signal to reduce the bit rate and thus the bandwidth required to transmit the signal.

The compressed bit stream is then provided to a forward error correction and interleaving component 104. The forward error correction and interleaving component 104 codes the signal for later error correction to improve the reliability of the information transmitted in the digital signal. The forward error coding can include, for example, Reed-Solomon encoding and Trellis coding. The data interleaving spreads related data over time and frequency to mitigate the effects of burst errors in the transmitted signal. The coded signal is then provided to an orthogonal frequency division multiplexer 106 that assigns the interleaved data to various orthogonal subchannels and combines the subchannels into a modulated signal. This signal is then provided to an upconverter 108 that upconverts the signal to a radio frequency.

An analog exciter 110 produces a frequency modulated (FM) analog signal from an analog carrier signal having an associated phase. The frequency modulated analog signal and the coded signal are provided to a multiplexer 112. The multiplexer 112 combines the two signals to form a hybrid signal. The signals are combined in such a way as to minimize interference between the signals. The combined signal is then provided to a modified Doherty amplifier system 114 that amplifies the combined signal to a level appropriate for transmission.

It will be appreciated that the combined signal comprises the sum of two uncorrelated signals, the constant envelope FM analog signal and the digital audio signal. In accordance with Ibiquity specifications for IBOC signals, the digital audio signal itself has a peak-to-average ratio of approximately 6 dB and is summed at a much lower level with respect to the FM carriers, typically 20 dB lower.

Taking these two factors into account, and considering that the addition of these carriers will both add and subtract vectorially over time, the minimum to maximum excursion of the envelope voltage can be calculated to have a voltage ratio of approximately 1.5 or a power ratio of around $(1.5)^2=2.25$. The envelope of an FM IBOC signal will thus never drop below 1/2.25, or 44%, of its maximum peak value.

Accordingly, the nonlinear main amplifier in the Doherty amplifier can be run at saturation at all times. As an activation voltage of the auxiliary amplifier can be selected such that it is exceeded when the signal power is above one-quarter peak power, the auxiliary amplifier is also active, and the signal power is distributed between the two amplifiers. Both amplifiers can thus be operated at saturation for all values of the signal power to provide enhanced efficiency. The signal is then provided to an associated antenna 118 for transmission.

Figure 5:
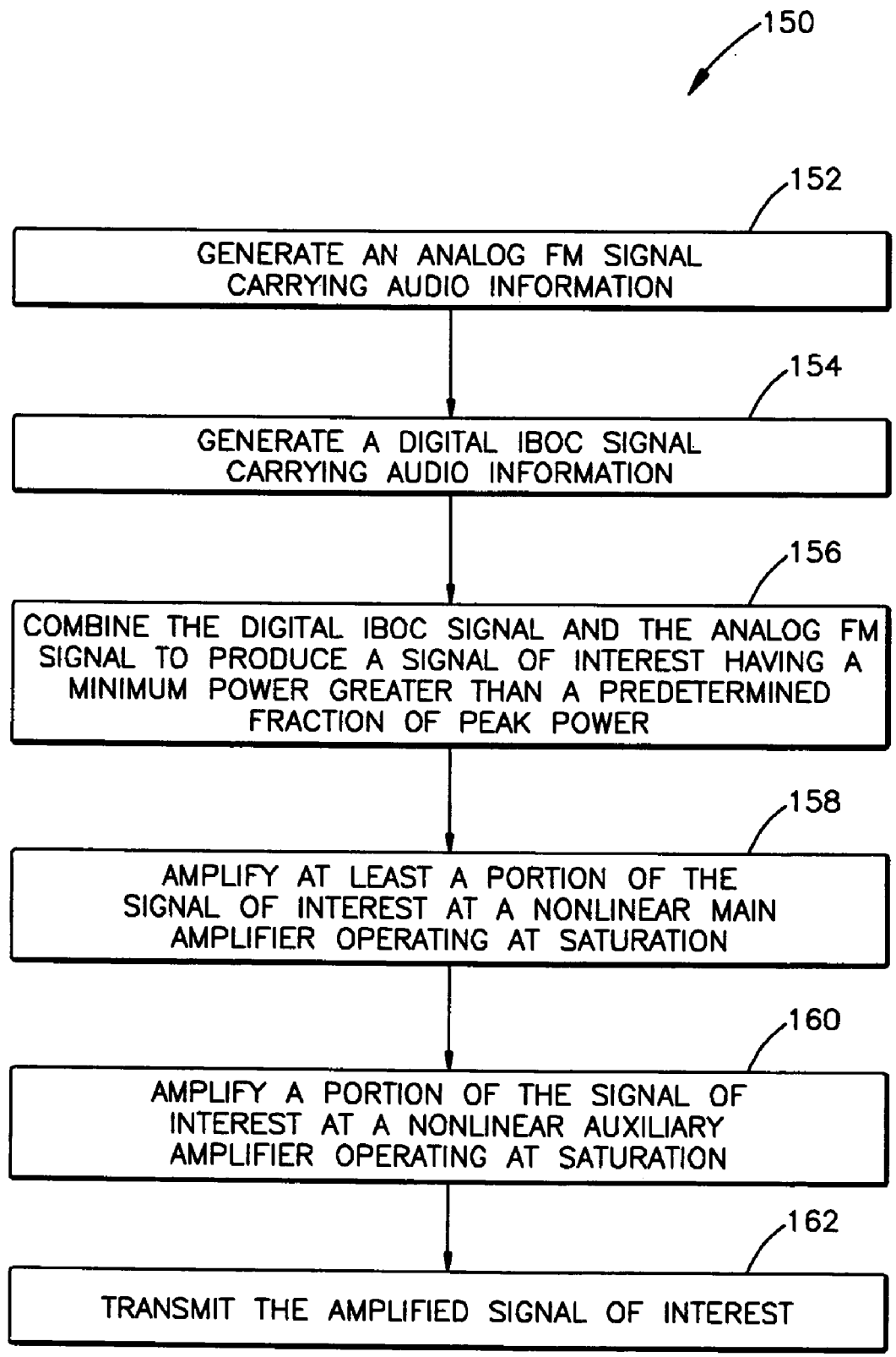
FIG. 5 illustrates a methodology for amplifying a signal in accordance with an aspect of the present invention.

FIG. 5 illustrates a methodology 150 for amplifying a signal in accordance with an aspect of the present invention. The illustrated methodology 150 allows for the efficient amplification of a signal over a limited range of amplitude modulation. Specifically, where a signal of interest is modulated such that the signal power does not drop below a fraction of the peak power, the signal can be amplified via a modified Doherty amplifier system that maintains two nonlinear amplifiers at saturation to maximize the efficiency of the system.

The methodology 150 begins at step 152, where an analog frequency modulated (FM) signal is generated. In an exemplary embodiment, a carrier signal can be frequency modulated to carry audio information. At step 154, a digital in-band, on-channel (IBOC) signal can be generated, also representing audio information. In one example, the analog signal can comprising a redundant, slightly delayed representation of the audio information carried in the digital signal.

At step 156, the digital IBOC signal is combined with the analog FM signal to produce a composite signal of interest. This composite signal of interest will have a minimum power that remains above one-quarter of the peak power of the signal. At step 158, a portion of the signal is amplified at a nonlinear main amplifier. At step 160, a portion of the signal is amplified at a nonlinear auxiliary amplifier. It will be appreciated that the two amplifiers can be connected in a parallel Doherty arrangement between the source of the signal and an associated load such that steps 158 and 160 can occur simultaneously. The amplified signal is then transmitted at step 162.

From the above description of the invention, those skilled in the art will perceive improvements, changes, and modifications. Such improvements, changes, and modifications within the skill of the art are intended to be covered by the appended claims.

Having described the invention we claim:

1. A modified Doherty amplifier system, comprising:
   a nonlinear main amplifier;
   a nonlinear auxiliary amplifier;
   an impedance-inverting network that separates the main amplifier from an associated load;
   a second quarter wave transmission line that separates the auxiliary amplifier from an associated signal source, the signal source having an associated minimum signal power, such that the signal power never drops below a predetermined percentage of a peak signal power.

2. The system of claim 1, the auxiliary nonlinear amplifier having an associated activation voltage, the associated activation voltage being achieved at an input power not greater than the minimum signal power.

3. The system of claim 1, wherein the minimum signal power is one-quarter of the peak signal power.

4. The system of claim 1, wherein the main amplifier has an associated first gain, and the auxiliary amplifier has a second associated gain, the first associated gain and the second associated gain being selected as to provide a region of linear amplification for the system.

5. The system of claim 1, wherein a nonlinear pre-correction component is used to achieve constant system gain and phase over the entire voltage range.

6. A transmitter comprising the modified Doherty amplifier system of claim 1.

7. The transmitter of claim 6, the transmitter being operative to produce and transmit a frequency modulated in-band, on-channel signal.

8. A method for amplifying a signal of interest, comprising the steps of:
   generating the signal of interest such that the signal of interest has a minimum power that is greater than a predetermined fraction of its peak power;
   amplifying a first portion of the signal power of the signal of interest at a first nonlinear amplifier operating in saturation; and
   amplifying a second portion of the signal power from the signal of interest at a second nonlinear amplifier operating at saturation.

9. The method of claim 8, wherein the step of generating the signal of interest includes combining a digital audio signal and a frequency modulated analog signal.

10. The method of claim 8, wherein the step of generating the signal of interest includes the use of a nonlinear precorrection component.

11. The method of claim 8, wherein the signal of interest is a frequency modulated analog signal incorporating an in-band, on-channel digital audio signal.

12. An amplifier system for amplifying an in-band, on-channel (IBOC) digital audio broadcasting composite radio frequency (RF) signal from an associated signal source to provide an amplified RF signal to an associated load comprising:
   a first nonlinear amplifier that operates in a saturated region;
   a second nonlinear amplifier that operates in a saturated region;
   wherein the first and second amplifier circuits are connected together in parallel and located intermediate to the signal source and the load.

13. The system of claim 12, the first amplifier being connected to the load through an impedance-inverting network and the second amplifier being connected to the signal source through a quarter wave transmission line.

14. The system of claim 12, wherein the signal source is limited, such that the signal power never drops below a predetermined percentage of a peak signal power.

15. The system of claim 14, wherein the predetermined percentage is one-quarter of the peak signal power.

16. The system of claim 12, wherein the main amplifier has an associated first gain, and the auxiliary amplifier has a second associated gain, the first associated gain and the second associated gain being selected as to provide a region of linear amplification for the system.

17. A transmitter comprising the modified Doherty amplifier system of claim 12.

* * * * *

UNITED STATES PATENT AND TRADEMARK OFFICE
CERTIFICATE OF CORRECTION

PATENT NO. : 7,248,110 B2  Page 1 of 1
APPLICATION NO. : 11/294742
DATED : July 24, 2007
INVENTOR(S) : Timothy Wilfred Dittmer et al.

It is certified that error appears in the above-identified patent and that said Letters Patent is hereby corrected as shown below:

Col. 1, line 51, before "quarter" delete "second".

Col. 5, line 61, before "quarter wave transmission line" delete "second".

Signed and Sealed this

Thirtieth Day of June, 2009

JOHN DOLL
*Acting Director of the United States Patent and Trademark Office*